United States Patent
Yoon et al.

(10) Patent No.: US 10,217,711 B2
(45) Date of Patent: Feb. 26, 2019

(54) SEMICONDUCTOR PACKAGE AND MANUFACTURING METHOD THEREOF

(71) Applicant: SAMSUNG ELECTRO-MECHANICS CO., LTD., Suwon-si (KR)

(72) Inventors: Sung Jae Yoon, Suwon-si (KR); Seong Jong Cheon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/789,070

(22) Filed: Oct. 20, 2017

(65) Prior Publication Data

US 2018/0277490 A1 Sep. 27, 2018

(30) Foreign Application Priority Data

Mar. 23, 2017 (KR) .................. 10-2017-0036739

(51) Int. Cl.

| | |
|---|---|
| *H01L 21/56* | (2006.01) |
| *H01L 23/31* | (2006.01) |
| *H01L 23/433* | (2006.01) |
| *H01L 23/498* | (2006.01) |
| *H01L 23/552* | (2006.01) |
| *H01L 25/065* | (2006.01) |

(52) U.S. Cl.
CPC .......... *H01L 23/552* (2013.01); *H01L 21/561* (2013.01); *H01L 23/3121* (2013.01); *H01L 23/3135* (2013.01); *H01L 23/4334* (2013.01); *H01L 23/49838* (2013.01); *H01L 25/0655* (2013.01); *H01L 23/49805* (2013.01); *H01L 23/49822* (2013.01)

(58) Field of Classification Search
CPC .......... H01L 23/4334; H01L 23/49805; H01L 23/49822; H01L 23/552; H01L 25/00–25/50
See application file for complete search history.

(56) References Cited

U.S. PATENT DOCUMENTS

| | | | | |
|---|---|---|---|---|
| 5,977,626 | A | * | 11/1999 | Wang .................. H01L 23/3128 257/691 |
| 2003/0109077 | A1 | | 6/2003 | Kim et al. |
| 2004/0065963 | A1 | * | 4/2004 | Karnezos ............ H01L 23/3128 257/777 |
| 2015/0325529 | A1 | | 11/2015 | Choi | |

FOREIGN PATENT DOCUMENTS

| | | |
|---|---|---|
| KR | 10-0431181 B1 | 5/2004 |
| KR | 10-2008-0046049 A | 5/2008 |
| KR | 10-1642560 B1 | 7/2016 |

* cited by examiner

*Primary Examiner* — Daniel P Shook
(74) *Attorney, Agent, or Firm* — NSIP Law

(57) ABSTRACT

A semiconductor package includes a ground electrode formed on an upper surface of a substrate, a first electronic component disposed on the upper surface of the substrate, a sealing member sealing the electronic component, and a shielding member surrounding the first electronic component and disposed in the sealing member.

20 Claims, 4 Drawing Sheets

SEMICONDUCTOR PACKAGE AND MANUFACTURING METHOD THEREOF

CROSS-REFERENCE TO RELATED APPLICATION(S)

This application claims the benefit under 35 USC § 119(a) of Korean Patent Application No. 10-2017-0036739 filed on Mar. 23, 2017, in the Korean Intellectual Property Office, the entire disclosure of which is incorporated herein by reference for all purposes.

BACKGROUND

1. Field

The following description relates to a semiconductor package and a manufacturing method thereof.

2. Description of Related Art

A miniaturized high frequency semiconductor package able to withstand a high frequency signal such as a communications module or a network module typically has various electromagnetic shielding structures in order to implement electromagnetic interference (EMI) or electromagnetic susceptibility (EMS) characteristics.

In a typical high frequency semiconductor package, individual devices are mounted on a substrate and then encapsulated by resin to protect the individual devices in a sealing member. Conventionally, a structure for forming a shielding member on an external surface of the sealing member is used as a structure for high frequency shielding.

Such a conventional shielding member is typically electrically connected to a ground pattern of a substrate. Since a connection portion of the ground pattern of the substrate and the shielding member is formed by a very fine pattern, the connection portion may be easily broken due to impact or the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a semiconductor package includes a ground electrode formed on an upper surface of a substrate, a first electronic component disposed on the upper surface of the substrate, a sealing member sealing the electronic component, and a shielding member surrounding the first electronic component and disposed in the sealing member.

The sealing member may include an internal sealing member disposed inside the shielding member and an external sealing member disposed outside the shielding member.

A portion of the ground electrode may be exposed externally of the internal sealing member and the ground electrode may be connected to the shielding member.

The shielding member may be in surface contact with the electronic component and the ground electrode.

A second electronic component may be disposed outside the shielding member.

The first electronic component may be mounted on the substrate using a flip chip bonding method. A portion of the shielding member may be disposed on an inactive surface of the first electronic component.

In a general aspect, a method of manufacturing a semiconductor package includes disposing an electronic component on a ground electrode disposed on a substrate, partially embedding the electronic component with an internal sealing member, surrounding the electronic component and the internal sealing member with a shielding member, and embedding the shielding member with an external sealing member.

The shielding member may be disposed using a sputtering method or a vapor deposition method.

The forming of the internal sealing member may include completely embedding the electronic component and the ground electrode with a sealing member, and partially removing the sealing member to expose the electronic component and the ground electrode.

The removing of the sealing member may include exposing an inactive surface of the electronic component by polishing the sealing member.

The removing of the sealing member may include exposing the ground electrode using a laser drilling method or an etching method.

The shielding member may be disposed along the internal sealing member, surfaces of the electronic component, and the ground electrode exposed externally of the internal sealing member.

The mounting of the electronic component may include bonding the electronic component having a form of a bare die to the substrate using a flip chip bonding method.

The semiconductor package may include a plurality of semiconductor packages disposed adjacent to one another and sharing a same substrate. The method may further include cutting the shared same substrate to form individual semiconductor packages.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
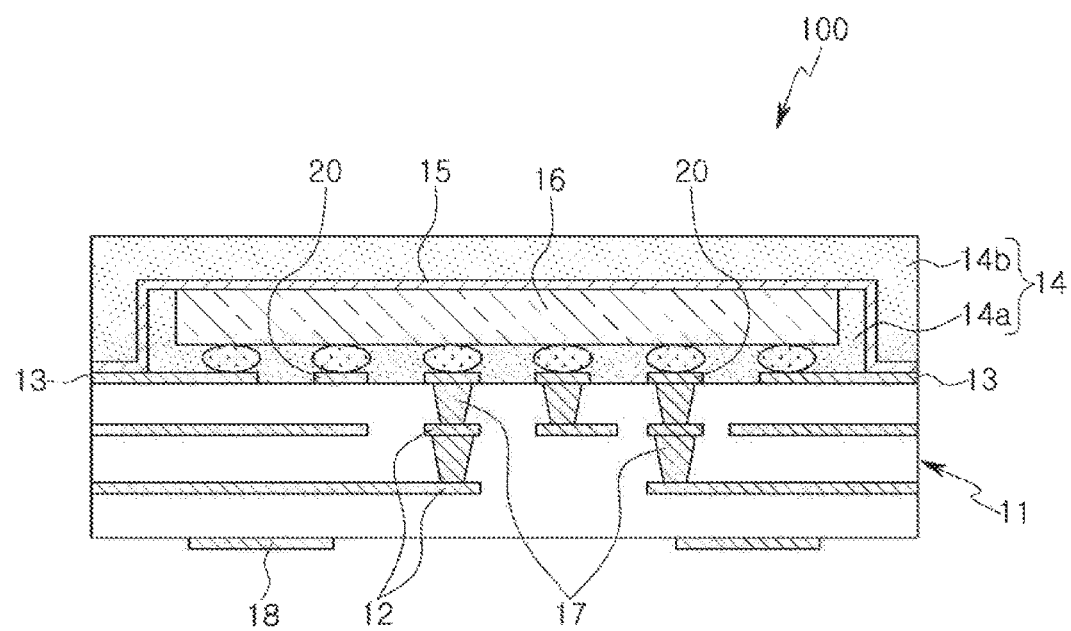
FIG. 1 is a cross-sectional view illustrating an example of a semiconductor package.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
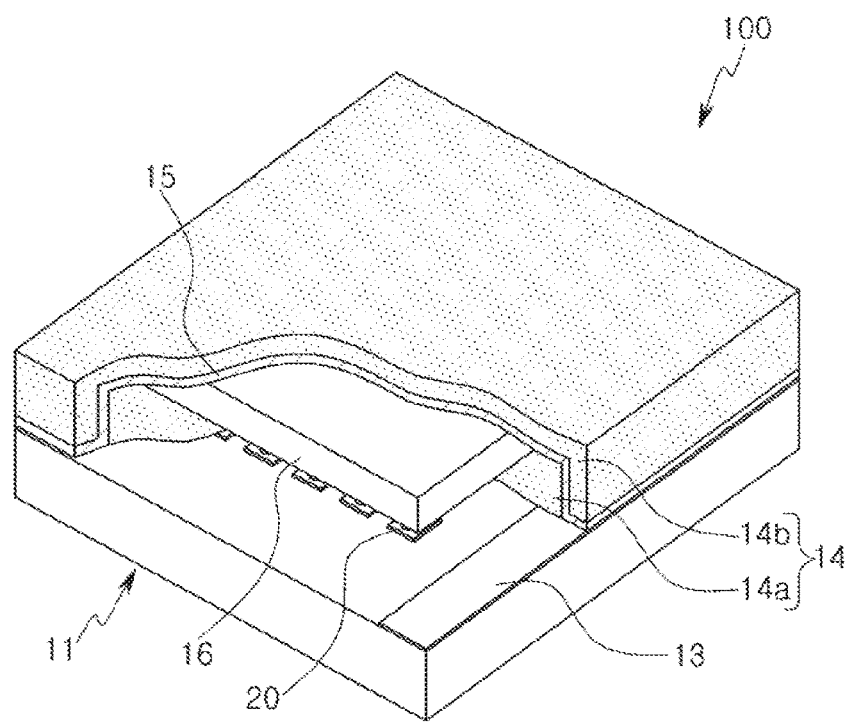
FIG. 2 is a perspective view of the semiconductor package shown in FIG. 1.

FIG. 1 is a cross-sectional view illustrating an example of a semiconductor package. FIG. 2 is a perspective view of the semiconductor package shown in FIG. 1.

As shown in FIGS. 1 and 2, a semiconductor package 100 includes a substrate 11, an electronic component 16, a sealing member 14, and a shielding member 15.

At least one electronic component 16 is mounted on an upper surface of the substrate 11. As the substrate 11, various kinds of substrates (for example, a ceramic substrate, a printed circuit board (PCB), a glass substrate, a flexible substrate, etc.) may be used.

A mounting electrode 20 for mounting the electronic component 16 or a circuit pattern (not shown) electrically connecting the mounting electrodes 20 to each other may be formed on the upper surface of the substrate 11. The substrate 11 is a multilayer substrate, and a circuit pattern 12 forming an electrical connection may be formed between the respective layers.

Also, an external connection electrode 18 electrically connected to the mounting electrode 20, the circuit pattern 12, the ground electrode 13, and the like, and an interlayer connection conductor 17 electrically connecting the mounting electrode 20, the circuit pattern 12, and the ground electrode 13 is provided in the substrate 11.

As shown in FIG. 1, the ground electrode 13 is formed on the upper surface of the substrate 11.

The ground electrode 13 is disposed adjacent to a side surface of the substrate 11 on the upper surface of the substrate 11, which may be formed in a square shape. One or more ground electrodes 13 may be provided.

The ground electrode 13 may be disposed along a periphery of an electronic component.

As shown in FIG. 1, a case in which only one electronic component is disposed on the substrate 11 is described as an example, and accordingly, the ground electrode 13 is formed along an outline of the substrate 11. However, multiple electronic components may be disposed on the substrate 11, as will be described later with reference to, for example, FIG. 11.

As shown in FIG. 2, the ground electrode 13 may be formed along one or more of four sides of the upper surface of the substrate 11. For example, various modifications are possible such as the ground electrode 13 being formed along opposite sides of the substrate 11 or on all four sides of the substrate 11.

In FIG. 2, the ground electrode 13 is formed to have a predetermined width along the side surface of the substrate 11, as an example. However, the ground electrode 13 is not limited thereto. When the ground electrode 13 is electrically connected to a terminal of the electronic component 16, as shown in FIG. 1, the ground electrode 13 may be formed such that a portion of the ground electrode 13 protrudes toward a lower portion of the electronic component 16, and thus a protruding portion may be electrically connected to the terminal (i.e., a ground terminal) of the electronic component 16.

The ground electrodes 13 may be formed to have the same width but are not limited thereto and may have different widths.

In FIG. 2, although a case where the ground electrode 13 is formed along the outline of the substrate 11 is used as an example, the configuration is not limited thereto. For example, a shape and position of the ground electrode 13 may be modified into various shapes as long as the ground electrode 13 may be joined to the shielding member 15, as in the embodiment shown in FIG. 11 (described later).

The electronic component 16 may be a device that generates excessive heat during operations. For example, a power amplifier is used as the electronic component 16. However, the configuration is not limited thereto, and various devices may be applied as long as the device has sufficient heat generation and may be embedded.

As shown in FIGS. 1 and 2, a case where only one electronic component 16 is mounted on a substrate is shown as an example, but the configuration is not limited thereto. The electronic component 16 may be understood as conceptually including a plurality of electronic devices.

For example, the electronic component 16 may include one or more of a variety of electronic devices such as a passive device and an active device.

The electronic component 16 according to the present embodiment is mounted on the substrate 11 using a flip chip bonding method. Thus, the electronic component 16 is mounted on the substrate 16 such that an active surface on which a terminal is formed faces the substrate 11, while the shielding member 15, which will be described later, is disposed on an inactive surface, a surface opposite of the active surface.

The sealing member 14 is formed on the substrate 11. Electronic component 16 mounted on the substrate 11 is embedded in the sealing member 14.

The sealing member 14 protects the electronic component 16 from an external impact by securing the electronic component 16 by surrounding the electronic component 16 from the outside. The sealing member 14 may be formed of an insulating material including a resin material such as epoxy or the like.

The sealing member 14 as shown in FIG. 1 may be divided into an internal sealing member 14a and an external sealing member 14b.

The internal sealing member 14a refers to the sealing member 14 located inside the shielding member 15 (to be described later) and the external sealing member 14b refers to the sealing member 14 located outside the shielding member 15.

The internal sealing member 14a contacts a side surface of the electronic component 16 and fills the inside of the shielding member 15. Therefore, the internal sealing member 14a is disposed along a periphery of the electronic component 16. At least a portion of the ground electrode 13 of the substrate 11 is exposed externally of the internal sealing member 14a.

The internal sealing member 14a and the external sealing member 14b may be formed of the same material, but is not limited thereto and may be formed of different materials.

The ground electrode 13 is formed around the internal sealing member 14a. At least a part of the ground electrode 13 is exposed externally of the internal sealing member 14a. The shielding member 15 is electrically connected to the exposed ground electrode 13.

The shielding member 15 may be a conductive film and may be interposed between the internal sealing member 14a and the external sealing member 14b. Therefore, the internal sealing member 14a and the electronic component 16 are located inside the shielding member 15.

The shielding member 15 is grounded for electromagnetic shielding. To this end, and referring to FIG. 1, the semiconductor package 10 is configured such that the shielding member 15 is electrically connected to the ground electrode 13. More specifically, the shielding member 15 is electrically connected to the ground electrode 13 exposed externally of the internal sealing member 14a on the upper surface of the substrate 11.

The shielding member 15 configured as described above accommodates the electronic component 16 therein and is formed on the outer surface of the sealing member 14 to shield unnecessary electromagnetic waves flowing from the outside of the substrate 11.

The shielding member 15 is disposed to be in surface contact with each of the inactive surface of the electronic component 16 and the ground electrode 13 of the substrate 11. Thus, heat generated in the electronic component 16 may be transferred to the shielding member 15 in surface contact with the inactive surface of the electronic component 16 and is transmitted to the substrate 11 through the ground electrode 13 of the substrate 11 and is then discharged externally through the substrate 11. As described above, the shielding member 15 externally discharges the heat generated from the electronic component 16.

Therefore, the shielding member 15 may be formed of a material having a high thermal conductivity and capable of shielding electromagnetic waves. For example, the shielding member 15 is formed of a resin material containing conductive powder, or is formed in form of a metal thin film.

The shielding member 15 may be formed of silver (Ag) or copper (Cu), and may be formed in form of a metal thin film using a sputtering method or a vapor deposition method. However, the shielding member 15 is not limited thereto, and various techniques such as spray coating, screen printing, electroplating, and electroless plating may be used to form the shielding member 15.

The semiconductor package 100 configured as described above may not only protect the electronic component 16 mounted on the substrate 11 from the outside through the sealing member 14 but may also shield electromagnetic waves using the shielding member 15 disposed inside the shielding member 15.

The shielding member 15 may be easily grounded using the ground electrode 13 formed on the upper surface of the substrate 11 to ground the shielding member 15.

Since the shielding member 15 as shown in FIGS. 1 and 2 is located between the internal sealing member 14a and the external sealing member 14b, the shielded part 15 may be prevented from being damaged by external force or external contact, etc.

Next, the manufacturing method of the above-described semiconductor package will be described. Since the method of manufacturing the semiconductor package described below is a method of manufacturing the semiconductor package described above, detailed descriptions of the same components will be omitted. The same components will be described with the same reference numerals.

FIGS. 3 through 10 are diagrams sequentially illustrating an exemplary method of manufacturing a semiconductor package.

Figure 3:
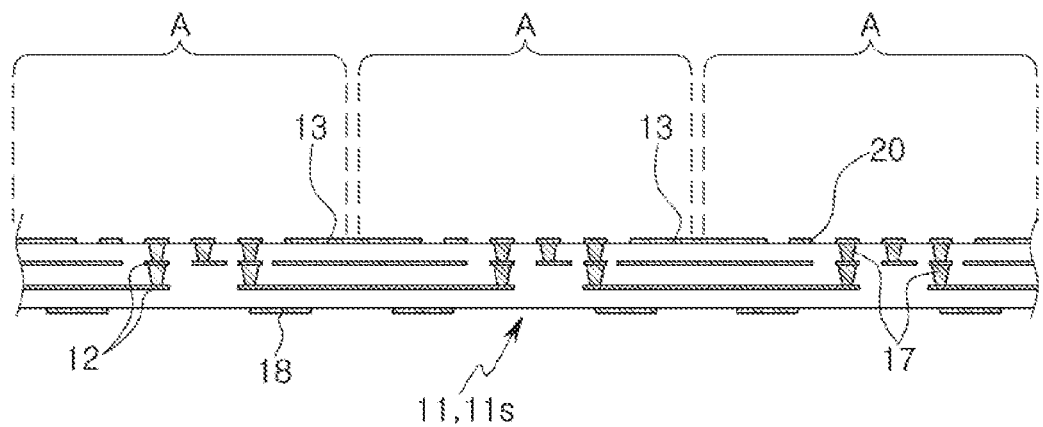
FIGS. 3, 4, 5, 6, 7, 8, 9, and 10 are diagrams sequentially illustrating an example of a method of manufacturing a semiconductor package.

Referring first to FIG. 3, the method of manufacturing the semiconductor package starts with preparing the substrate 11.

The substrate 11 is a multilayer circuit board formed of a plurality of layers. Circuit patterns electrically connected to each other are formed between the layers. More specifically, the circuit pattern 12, the external connection electrode 18, the mounting electrode 20, the ground electrode 13, the interlayer connection conductor 17, and the like shown in FIG. 1 are formed.

The substrate 11 is a substrate (hereinafter referred to as a strip substrate 11s) in form of a strip or a panel. The strip substrate 11s is used to form a plurality of individual semiconductor packages 10 simultaneously. The strip substrate 11s is divided into a plurality of individual semiconductor package regions A. The semiconductor package 10 is manufactured for each of the plurality of individual semiconductor package regions (A in FIG. 4A).

The ground electrode 13 is disposed on an upper surface of the strip substrate 11s. When the strip substrate 11s is cut for each of the individual semiconductor package regions A, the ground electrode 13 may be arranged to be formed along a side surface of the cut individual substrate 11.

The ground electrode 13 may be formed on the substrate 11 through a photolithography process.

Figure 4:
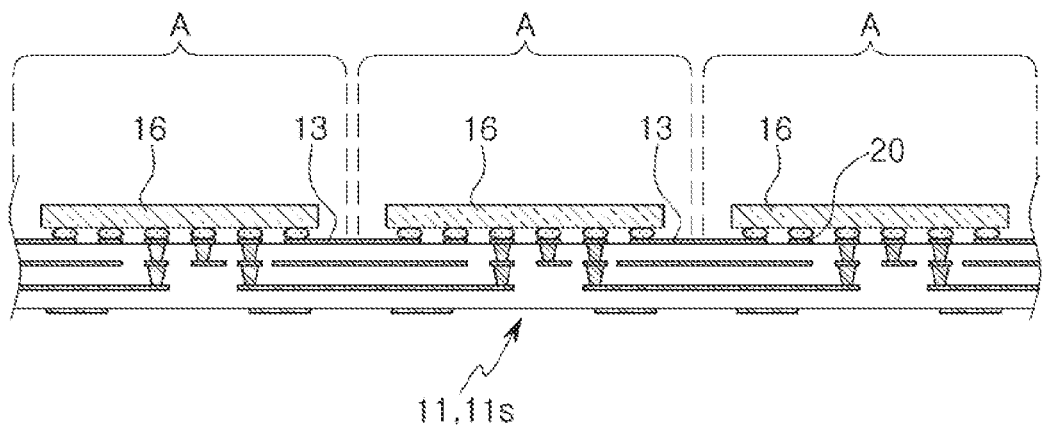

Next, a step of mounting the electronic component 16 on one surface of the substrate 11 is performed, as shown in FIG. 4. At this time, the electronic component 16 may be repeatedly mounted on all the individual semiconductor package regions A of the substrate 11. That is, the electronic components 16 may be arranged and mounted with the same kind and quantity for each of the individual semiconductor package regions A. However, different or alternating electronic components may be disposed in neighboring individual semiconductor package regions A.

The electronic component 16 is provided in a form of a bare die and is mounted on the substrate 11 using a flip chip bonding method. Therefore, the active surface on which the terminal is formed is mounted on the substrate 11 so as to face the substrate 11, and the inactive surface on the opposite side of the active surface is arranged to face upward, as shown in FIG. 4.

Figure 5:
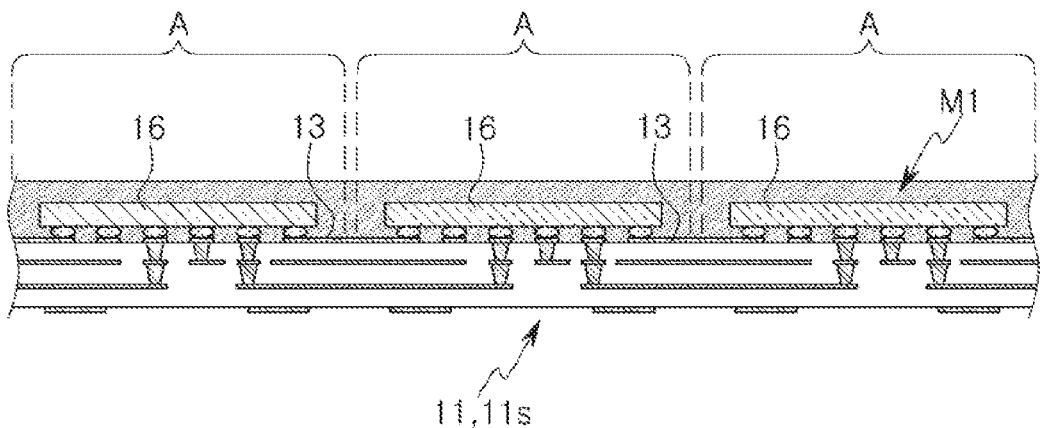

Then, as shown in FIG. 5, a step of forming a first sealing member on one surface of the substrate 11 on which the electronic component 16 is mounted is performed.

The first sealing member M1 is formed on one surface of the substrate 11 to seal the electronic component 16 completely. The first sealing member M1 is formed integrally on the strip substrate 11s so as to cover all of the individual semiconductor package regions A. Alternatively, the first sealing member M1 may be separately formed for each of the individual semiconductor package regions A.

Figure 6:
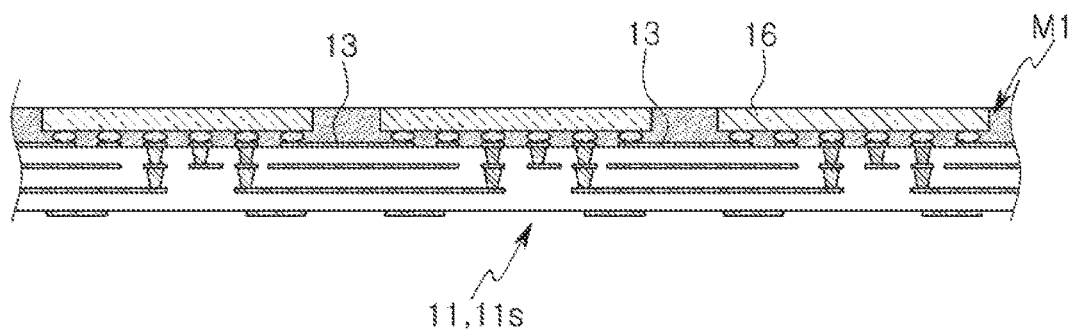

Then, as shown in FIG. 6, a step of removing the first sealing member M1 formed on the upper portion of the electronic component 16 is performed. The first sealing member M1 may be removed by polishing a corresponding portion using a grinder or the like.

The first sealing member M1 is polished and removed until the upper surface (e.g., the inactive surface) of the electronic component 16 is exposed, whereby the exposed surface of the electronic component 16 is disposed in the same plane as a surface of the first sealing member M1. As shown in FIG. 6, A thickness of the first sealing member M1 is formed to be equal to a mounting height of the electronic component 16.

Figure 7:
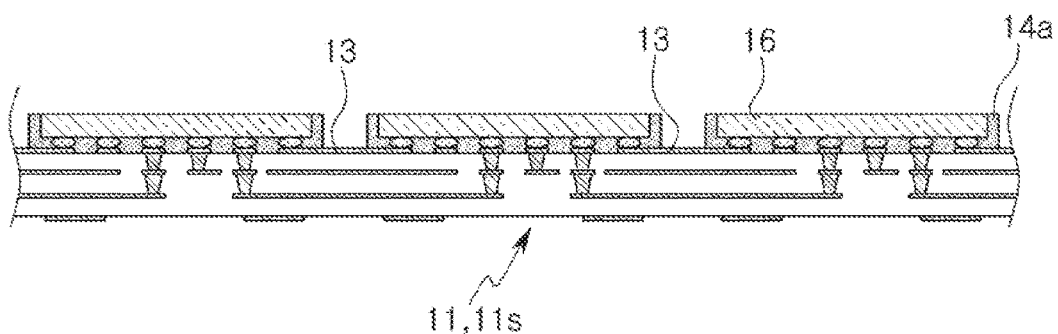

Subsequently, as shown in FIG. 7, a step of exposing the ground electrode 13 externally by removing a part of the first sealing member M1 is performed.

In this step, a portion of the first sealing member M1 disposed around the electronic component 16 is removed. Thus, manipulation of the first sealing member M1 is completed to form the internal sealing member 14a of FIG. 1.

The first sealing member M1 may be partially removed by a laser drilling method or an etching method. However, the partial removal of the first sealing member M1 is not limited thereto.

Figure 8:
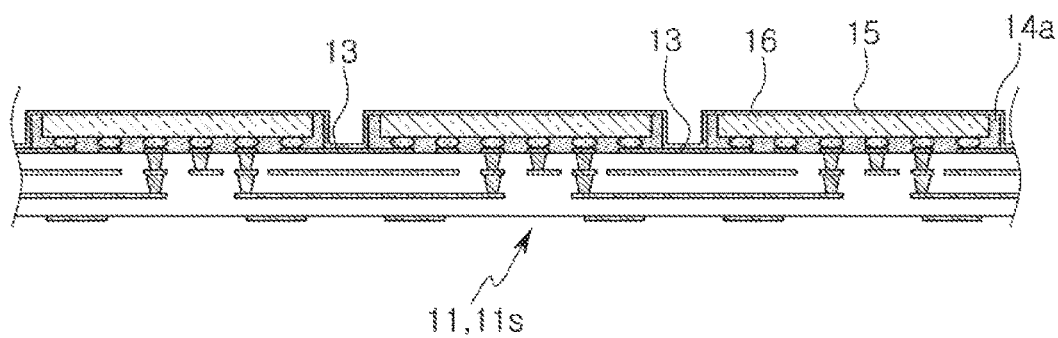

Next, as shown in FIG. 8, a step of forming the shielding member 15 on the outer surface of the internal sealing member 14a is performed.

The shielding member 15 is formed on the surfaces of the internal sealing member 14a and the ground electrode 13.

As described above, the upper surface (e.g., the inactive surface) of the electronic component 16 is exposed externally of the internal sealing member 14a. Therefore, as shown in FIG. 8, the shielding member 15 is formed on the entire upper surface of the strip substrate 11s along the inner sealing portion 14a, the inactive surface of the electronic component 16, and the surface of the ground electrode 13.

Figure 11:
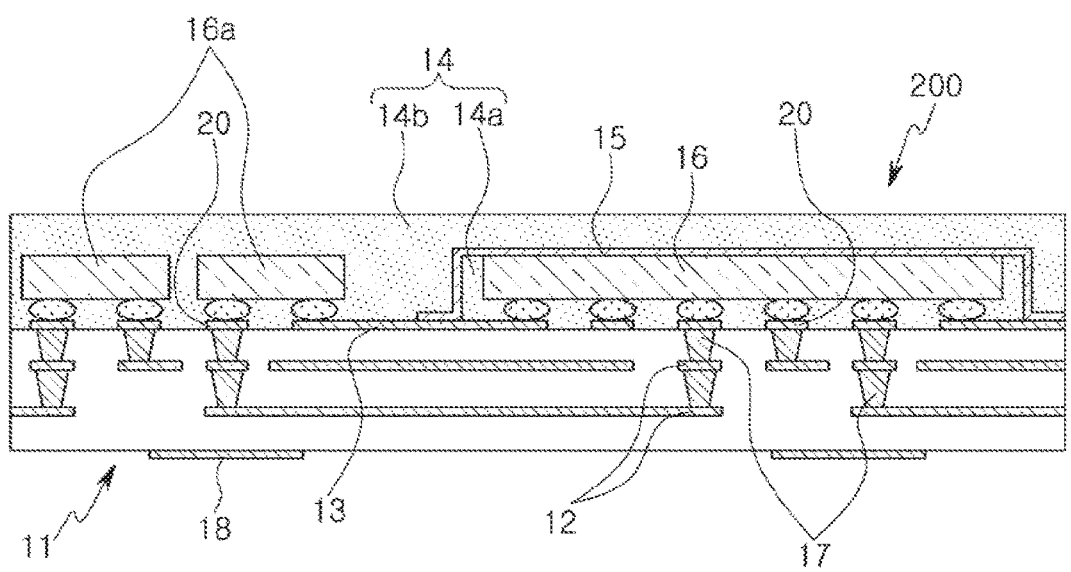
FIG. 11 is a schematic cross-sectional view illustrating an example of a semiconductor package.

However, when a plurality of electronic components 16 and 16a are mounted on the substrate 11 as in the embodiment shown in FIG. 11, the shielding member 15 is not formed entirely on the substrate 11 and may be partially formed.

The shielding member 15 is formed on both the upper surface and the side surface of the internal sealing member 14a and is also formed on the ground electrode 13 exposed externally of the internal sealing member 14a. Thus, the shielding member 15 is electrically connected to the ground electrode 13.

The shielding member 15 may be formed of a metal thin film made of silver (Ag) or copper (Cu). In this case, the metal thin film may be formed by a sputtering method or a vapor deposition method. However, the composition of the metal thin film and method of forming is not limited thereto.

The method of manufacturing the semiconductor package may include a step of performing plasma processing on the surface of the shielding member 15 to improve abrasion resistance and corrosion resistance of the surface of the shielding member 15 after the shielding member 15 is formed.

Figure 9:
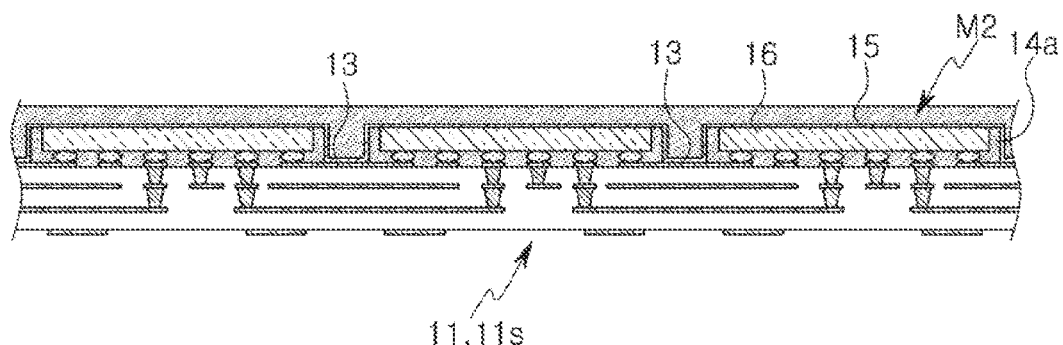

Then, as shown in FIG. 9, a step of forming a second sealing member M2 on the shielding member 15 to form the external sealing member 14b is performed.

The second sealing member M2 is formed on one surface of the substrate 11 by completely sealing the internal sealing member 14a and the shielding member 15. In this step, the second sealing member M2 is integrally formed on the strip substrate 11s so as to cover all of the individual semiconductor package regions A. However, the second sealing member M2 may be separately formed for each of the individual semiconductor package regions A.

The second sealing member M2 formed in this step may be formed of the same material as the first sealing member M1 forming the internal sealing member 14a. However, the second sealing member M2 is not limited thereto, and may be formed of a different material from the first sealing member M1 forming the internal sealing member 14a.

Figure 10:
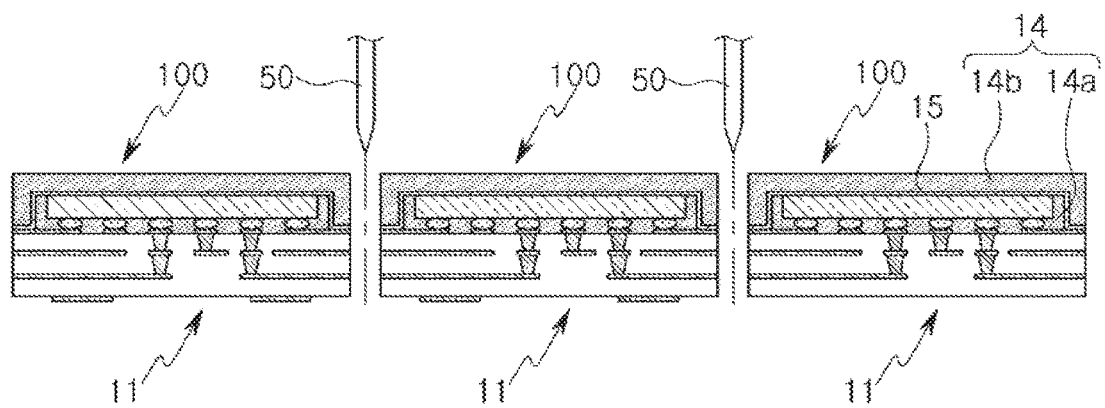

Then, as shown in FIG. 10, a step of cutting the strip substrate 11s to form an individual semiconductor package 100 is performed. A cutting process of this step is performed by cutting the substrate 11 on which the sealing member 14 is formed using a blade 50.

Accordingly, the second sealing member M2 is formed into the external sealing member 14b, thereby completing the semiconductor package 100 shown in FIG. 1.

In the method of manufacturing the semiconductor package shown in FIGS. 3-10, the cutting process is performed in a state in which the external sealing member 14b is formed on the shielding member 15. Therefore, the shielding member 15 may be prevented from being lifted or peeled off in the cutting process.

The semiconductor package according to the present disclosure is not limited to the above-described embodiments, and various modifications are possible.

FIG. 11 is a schematic cross-sectional view illustrating an example of a semiconductor package.

A semiconductor package 200 is configured similarly to the semiconductor package 100 described above and shown in FIG. 1, and differs in that the plurality of electronic components 16 and 16a are mounted on the substrate 11.

As shown in FIG. 11, the electronic components 16 and 16a may be divided into a first device 16 positioned in the shielding member 15 and a second device 16a disposed outside of the shielding member 15. In this regard, the first device 16 may be the same component as the electronic component (16 in FIG. 1) of the above-described embodiment.

Since the second device 16a is located outside the shielding member 15, the second device 16a is not in contact with the internal sealing member 14a but is sealed only by the external sealing member 14b. The shielding member 15 is disposed only on the surfaces of the internal sealing member 14a, and the first device 16, and the ground electrode 13, and does not extend to other regions.

The semiconductor package 200 shown in FIG. 11 configured as described above may prevent electromagnetic interference that may occur between the first device 16 and the second device 16a. Since the internal sealing member 14a and the shielding member 15 may be partially formed on the substrate 11, the various electronic components 16 and 16a may be efficiently arranged on the one substrate 11.

Although only the one internal sealing member 14a is shown in the present embodiment, the present disclosure is not limited thereto. Various arrangements are possible. For example, the plurality of internal sealing members 14a may be disposed, and the shielding members 15 may be respectively formed on the surfaces of the internal sealing members 14a.

The semiconductor package and the manufacturing method thereof according to the present disclosure described above are not limited to the above-described embodiments, and various applications are possible. In the above-described embodiments, although the semiconductor package having a shielding member has been described as an example, the present disclosure is not limited thereto, and any device having a shielding portion for shielding electromagnetic waves may be applied variously.

As set forth above, in the semiconductor package of the present disclosure, since a shielding member is located between an internal sealing member and an external sealing member, it is possible to prevent the shielding member from being damaged by external force or external contact. Further, since the shielding member is disposed to be in surface contact with an electronic component, an electromagnetic shielding function as well as a heat dissipating function may be performed.

According to the semiconductor package manufacturing method of the present disclosure, a cutting process is performed when the external sealing member is formed on the shielding member. Therefore, it is possible to prevent the shielding member from being lifted or peeled off in the cutting process.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package, comprising:
   a substrate;
   a ground electrode disposed on an upper surface of the substrate;
   at least one electronic component disposed on the upper surface of the substrate;
   an internal sealing member sealing the electronic component; and
   a shielding member surrounding the electronic component and disposed in an external sealing member,
   wherein the shielding member separates the internal sealing member from the external sealing member.

2. The semiconductor package of claim 1, wherein the entire internal sealing member is blocked from contact with the external sealing member by the shielding member.

3. The semiconductor package of claim 2, wherein a portion of the ground electrode is exposed externally of the internal sealing member and the ground electrode is connected to the shielding member.

4. The semiconductor package of claim 1, wherein the shielding member is in surface contact with the electronic component and the ground electrode.

5. The semiconductor package of claim 4, wherein the shielding member is in surface contact with the substrate.

6. The semiconductor package of claim 1, further comprising at least one electronic component disposed outside the shielding member.

7. The semiconductor package of claim 1,
   wherein the electronic component is mounted on the substrate using a flip chip bonding method, and
   wherein a portion of the shielding member is disposed on an inactive surface of the electronic component.

8. A method of manufacturing the semiconductor package of claim 1, the method comprising:
   disposing an electronic component on a substrate, the substrate comprising a ground electrode;
   partially embedding the electronic component with an internal sealing member;
   surrounding the electronic component and the internal sealing member with a shielding member; and
   embedding the shielding member with an external sealing member.

9. The method of claim 8, wherein the shielding member is disposed using a sputtering method or a vapor deposition method.

10. The method of claim 8, wherein the forming of the internal sealing member comprises:
    completely embedding the electronic component and the ground electrode with a sealing member; and
    partially removing the sealing member to expose the electronic component and the ground electrode.

11. The method of claim 10, wherein the removing of the sealing member comprises exposing an inactive surface of the electronic component by polishing the sealing member.

12. The method of claim 10, wherein the removing of the sealing member comprises exposing the ground electrode using a laser drilling method or an etching method.

13. The method of claim 8, wherein the shielding member is disposed along the internal sealing member, surfaces of the electronic component, and the ground electrode exposed externally of the internal sealing member.

14. The method of claim 8, wherein the mounting of the electronic component comprises bonding the electronic component having a form of a bare die to the substrate using a flip chip bonding method.

15. The method of claim 8, wherein the semiconductor package comprises a plurality of semiconductor packages disposed adjacent to one another and sharing a same substrate.

16. The method of claim 15, further comprising cutting the shared same substrate to form individual semiconductor packages.

17. The semiconductor package of claim 1, wherein the shielding member seals the internal sealing member inside the shielding member.

18. The semiconductor package of claim 1, wherein the shielding member comprises a thin film.

19. The semiconductor package of claim 18, wherein the shielding member comprises a metal thin film.

20. The semiconductor package of claim 1, wherein the shielding member comprises a planar flange in direct contact with the substrate.

* * * * *